(12) United States Patent
Kim

(10) Patent No.: US 11,810,849 B2
(45) Date of Patent: *Nov. 7, 2023

(54) CONNECTION STRUCTURE AND METHOD OF FORMING THE SAME

(71) Applicant: SAMSUNG ELECTRONICS CO., LTD., Suwon-si (KR)

(72) Inventor: Jongyoun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/857,696

(22) Filed: Jul. 5, 2022

(65) Prior Publication Data
US 2022/0336338 A1 Oct. 20, 2022

Related U.S. Application Data

(63) Continuation of application No. 17/085,436, filed on Oct. 30, 2020, now Pat. No. 11,437,310, which is a (Continued)

(30) Foreign Application Priority Data

Dec. 6, 2018 (KR) ........................ 10-2018-0155947

(51) Int. Cl.
H05K 1/11 (2006.01)
H05K 1/18 (2006.01)
(Continued)

(52) U.S. Cl.
CPC .... *H01L 23/49838* (2013.01); *H01L 21/4857* (2013.01); *H01L 23/49816* (2013.01);
(Continued)

(58) Field of Classification Search
CPC ........... H01L 23/49838; H01L 21/4857; H01L 23/49816; H01L 23/49822;
(Continued)

(56) References Cited

U.S. PATENT DOCUMENTS 9,425,178 B2 8/2016 Lin et al.
9,431,367 B2 8/2016 Lin et al.
(Continued)

FOREIGN PATENT DOCUMENTS

KR 10-2009-0092032 A 8/2009
KR 10-1707931 B1 2/2017

*Primary Examiner* — Ishwarbhai B Patel
(74) *Attorney, Agent, or Firm* — Sughrue Mion, PLLC

(57) ABSTRACT

Provided is a connection structure for a semiconductor package which includes: a first passivation layer having an opening; a first conductive pattern that penetrates the first passivation layer and protrudes upwardly from the first passivation layer; a second passivation layer on the first passivation layer and covering the first conductive pattern; a second conductive pattern on the second passivation layer and electrically connected to the first conductive pattern; a third passivation layer on the second passivation layer and covering the second conductive pattern; and an external terminal in the opening and electrically connected to the first conductive pattern, wherein the first conductive pattern is thicker than the second conductive pattern.

20 Claims, 17 Drawing Sheets

Related U.S. Application Data continuation of application No. 16/447,441, filed on Jun. 20, 2019, now Pat. No. 10,833,002.

(51) Int. Cl.
| | |
|---|---|
| *H01L 23/498* | (2006.01) |
| *H01L 21/48* | (2006.01) |
| *H01L 23/00* | (2006.01) |
| *H01L 23/538* | (2006.01) |
| *H01L 23/31* | (2006.01) |
| *H01L 25/065* | (2023.01) |
| *H05K 1/02* | (2006.01) |
| *H05K 1/03* | (2006.01) |

(52) U.S. Cl.
CPC .. *H01L 23/49822* (2013.01); *H01L 23/49827* (2013.01); *H05K 1/11* (2013.01); *H05K 1/111* (2013.01); *H05K 1/182* (2013.01); *H01L 23/3128* (2013.01); *H01L 23/3135* (2013.01); *H01L 23/5383* (2013.01); *H01L 24/16* (2013.01); *H01L 24/48* (2013.01); *H01L 25/0657* (2013.01); *H01L 2224/16227* (2013.01); *H01L 2224/48229* (2013.01); *H05K 1/0284* (2013.01); *H05K 1/0298* (2013.01); *H05K 1/0306* (2013.01); *H05K 1/0313* (2013.01); *H05K 1/115* (2013.01); *H05K 1/18* (2013.01); *H05K 1/181* (2013.01); *H05K 2201/10378* (2013.01)

(58) Field of Classification Search
CPC .......... H01L 23/49827; H01L 23/3128; H01L 23/3135; H01L 23/5383; H01L 24/16; H01L 24/48; H01L 25/0657; H01L 2224/16227; H01L 2224/48229; H01L 2224/81005; H01L 2224/97; H01L 21/6835; H01L 24/13; H01L 24/17; H01L 24/32; H01L 24/73; H01L 24/81; H01L 24/97; H01L 25/03; H01L 2221/68359; H01L 2224/0401; H01L 2224/131; H01L 2224/17515; H01L 2224/32145; H01L 2224/32225; H01L 2224/48091; H01L 2224/48227; H01L 2224/73204; H01L 2224/73265; H01L 2224/81815; H01L 2224/92125; H01L 2225/0651; H01L 2225/06568; H01L 2924/15311; H01L 2924/15331; H01L 2924/3025; H01L 2924/3511; H01L 24/02; H01L 21/56; H01L 24/03; H01L 2224/02331; H01L 2224/02381; H01L 2224/031; H01L 23/528; H01L 23/315; H01L 23/481; H01L 23/525; H01L 24/14; H05K 1/11; H05K 1/111; H05K 1/0298; H05K 1/18; H05K 1/181

See application file for complete search history.

(56) References Cited

U.S. PATENT DOCUMENTS

| | | | |
|---|---|---|---|
| 9,576,931 | B1 | 2/2017 | Shih |
| 9,620,482 | B1 | 4/2017 | Chen et al. |
| 9,756,738 | B2 | 9/2017 | Hu |
| 9,806,063 | B2 | 10/2017 | Kim et al. |
| 9,887,148 | B1 | 2/2018 | Huang et al. |
| 10,014,260 | B2 | 7/2018 | Tsai et al. |
| 11,437,310 | B2 * | 9/2022 | Kim .................. H01L 23/49816 |
| 2003/0178229 | A1 | 9/2003 | Toyoda et al. |
| 2012/0028458 | A1 * | 2/2012 | Cabral, Jr. ............. H01L 24/14 |
| | | | 257/E23.115 |
| 2015/0016079 | A1 | 1/2015 | Furutani et al. |
| 2015/0145628 | A1 | 5/2015 | Kim et al. |
| 2016/0056100 | A1 | 2/2016 | Yeh |
| 2016/0064309 | A1 | 3/2016 | Su et al. |
| 2016/0141255 | A1 * | 5/2016 | Lu ......................... H01L 23/147 |
| | | | 257/737 |
| 2016/0141262 | A1 * | 5/2016 | Hu ....................... H01L 21/6835 |
| | | | 257/738 |
| 2018/0130749 | A1 | 5/2018 | Tsai et al. |
| 2020/0013721 | A1 | 1/2020 | Chiang et al. |

\* cited by examiner

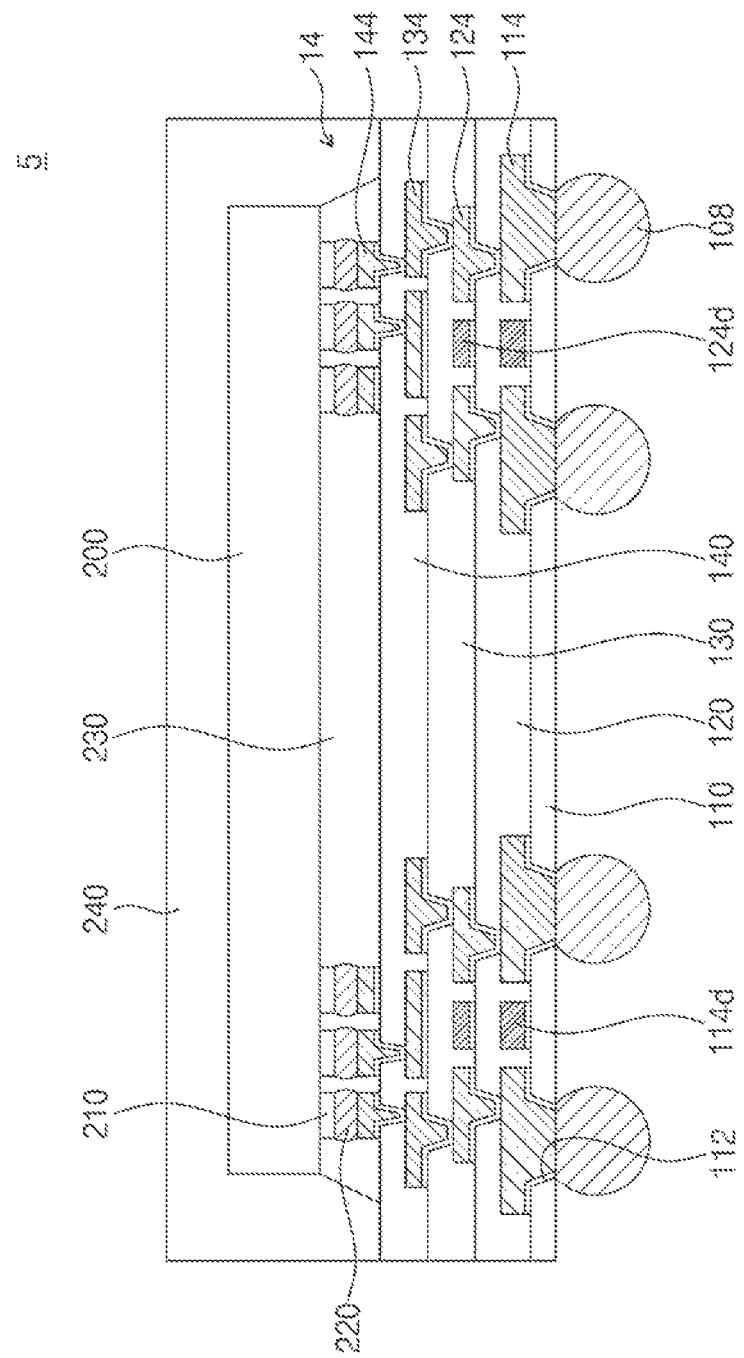

CONNECTION STRUCTURE AND METHOD OF FORMING THE SAME

CROSS-REFERENCE TO THE RELATED APPLICATIONS

This application is a Continuation Application of U.S. application Ser. No. 17/085,436, filed on Oct. 30, 2020, now U.S. Pat. No. 11,437,310, issued on Sep. 6, 2022, which is a Continuation Application of U.S. application Ser. No. 16/447,441, filed on Jun. 20, 2019, now U.S. Pat. No. 10,833,002, issued on Nov. 10, 2020, which claims priority from Korean Patent Application No. 10-2018-0155947 filed on Dec. 6, 2018 in the Korean Intellectual Property Office, the disclosures of which are incorporated herein by reference in their entirety.

BACKGROUND

Example embodiments of the present inventive concepts relate to a connection structure for a semiconductor package and a method of forming the same.

Semiconductor chips are increasingly downsized with the continuous development of semiconductor technology. In contrast, various functions are integrated into a single semiconductor chip. Therefore, semiconductor chips have a great number of input/output pads on a small area.

As a result, an improved semiconductor chip packaging has been considered.

SUMMARY

Example embodiments of the inventive concepts provide a connection structure with improved structural stability for a semiconductor package and a method of forming the same.

The example embodiments also provide a connection structure with enhanced electrical characteristics for a semiconductor package and a method of forming the same.

The example embodiments further provide a connection structure without pattern abnormality for a semiconductor package and a method of forming the same.

According to an aspect of the example embodiments, there is provided a connection structure which may include: a first passivation layer having an opening; a first conductive pattern that penetrates the first passivation layer and protrudes upwardly from the first passivation layer; a second passivation layer on the first passivation layer and covering the first conductive pattern; a second conductive pattern on the second passivation layer and electrically connected to the first conductive pattern; a third passivation layer on the second passivation layer and covering the second conductive pattern; and an external terminal in the opening and electrically connected to the first conductive pattern. The first conductive pattern may be thicker than the second conductive pattern.

According to an aspect of the example embodiments, there is provided a connection structure which may include: a carrier substrate; a first passivation layer, a second passivation layer, and a third passivation layer that are sequentially provided on the carrier substrate; a first conductive pattern that penetrates the first passivation layer and protrudes upwardly from the first passivation layer; and a second conductive pattern on the second passivation layer and electrically connected to the first conductive pattern. The first conductive pattern may be thicker than the second conductive pattern.

According to an aspect of the example embodiments, there is provided a method of forming a connection structure which may include: forming on a carrier substrate a first passivation layer having a plurality of first openings; forming a plurality of first conductive patterns that fill the first openings and protrude upwardly from the first passivation layer; forming on the first passivation layer a second passivation layer having a plurality of second openings that expose the first conductive patterns; forming on the second passivation layer a plurality of second conductive patterns that fill the second openings and have electrical connection with the first conductive patterns; and forming on the second passivation layer a third passivation layer that covers the second conductive patterns.

BRIEF DESCRIPTION OF THE DRAWINGS

FIGS. 4A to 4F illustrate cross-sectional views showing examples of the semiconductor package shown in FIG. 3D according to example embodiments.

DETAILED DESCRIPTION OF THE EXAMPLE EMBODIMENTS

Figure 1A:
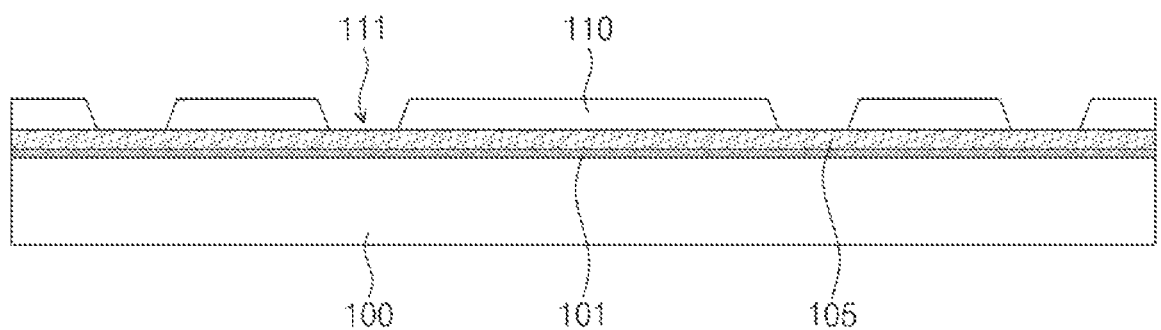
FIGS. 1A to 1G illustrate cross-sectional views showing a method of forming a connection structure for a semiconductor package according to example embodiments.

The following will now describe a connection structure for a semiconductor package and a method of forming the same according to example embodiments of the inventive concepts in conjunction with the accompanying drawings.

The advantages and aspects of the inventive concepts will be apparent through the appended claims and the specification discussed with reference to the accompanying drawings. The inventive concepts are distinctly claimed and particularly pointed out in the claims. However, the inventive concepts may best be understood by reference to the specification in conjunction with the accompanying drawings. In the specification, like reference numerals refer to like components throughout the accompanying drawings.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

FIGS. 1A to 1G illustrate cross-sectional views showing a method of forming a connection structure for a semiconductor package according to example embodiments. FIG. 1H illustrates an enlarged cross-sectional view showing a portion of FIG. 1G.

Referring to FIG. 1A, a carrier substrate 100 may be provided. The carrier substrate 100 may be a rigid substrate including a conductive material, a semiconductor material, or a dielectric material. For example, the carrier substrate 100 may be a bare silicon wafer or a glass substrate. A lower passivation layer 105 may be formed on the carrier substrate 100.

The lower passivation layer 105 may include a dielectric material. For example, the lower passivation layer 105 may be formed by depositing silicon oxide, silicon nitride, or polymer. A dielectric material may be deposited on the lower passivation layer 105, and then, patterned to form a first passivation layer 110 having one or more first openings 111.

The first passivation layer 110 may include a material the same as or similar to that of the lower passivation layer 105. For example, the first passivation layer 110 may include silicon oxide, silicon nitride, or polymer. Each of the first openings 111 may partially reveal the lower passivation layer 105. When viewed in plan, each of the first openings 111 may have a circular shape, an elliptical shape, a rectangular shape, a polygonal shape, or an arbitrary shape.

An adhesive layer 101 may further be provided between the carrier substrate 100 and the lower passivation layer 105. The adhesive layer 101 may be a photosensitive adhesive. In the following descriptions, the adhesive layer 101 will be omitted in the interest of brevity.

Figure 1B:
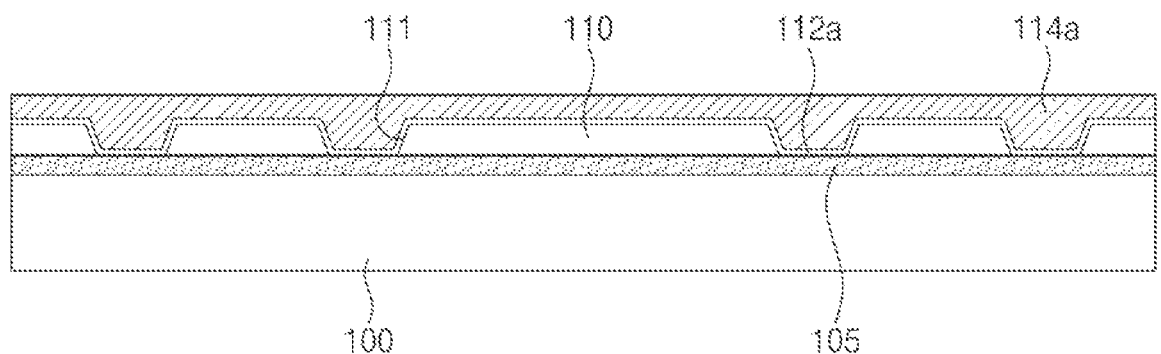

Referring to FIG. 1B, the carrier substrate 100 may be provided thereon with a first seed layer 112a having a relatively smaller thickness and a first conductive layer 114a having a relatively larger thickness. The first seed layer 112a may cover the first passivation layer 110, and also cover the lower passivation layer 105 that is partially exposed through the first openings 111. The first conductive layer 114a may have a thickness sufficient enough to cover the first seed layer 112a and fill the first openings 111.

The first seed layer 112a may be formed by plating or depositing metal or its alloy, such as copper (Cu), titanium (Ti), a combination thereof, or an alloy thereof, the same as or similar to that of the first conductive layer 114a. The first conductive layer 114a may be formed by an electroplating process using the first seed layer 112a. The first conductive layer 114a may include, for example, copper (Cu), aluminum (Al), nickel (Ni), gold (Au), silver (Ag), platinum (Pt), a combination thereof, or an alloy thereof.

Figure 1C:
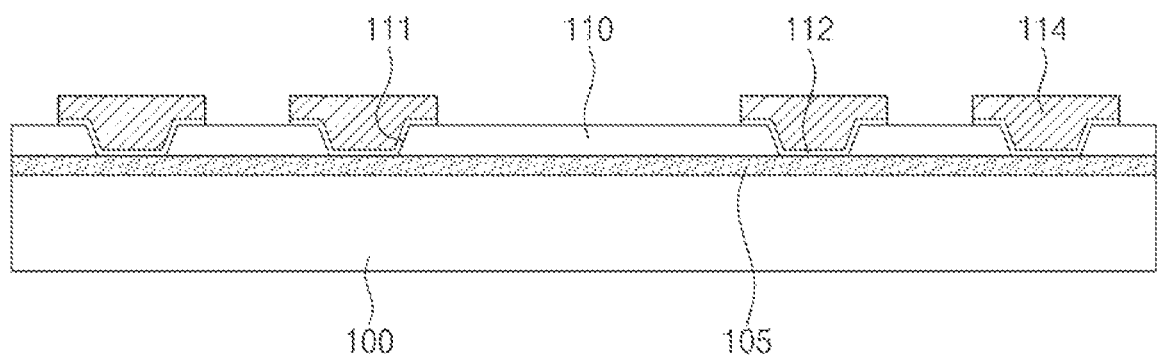

Referring to FIG. 1C, the first seed layer 112a and the first conductive layer 114a may be converted respectively into first seed patterns 112 and first conductive patterns 114. For example, the first seed layer 112a may be patterned to form the first seed patterns 112 separated from one another. Likewise, the first conductive layer 114a may be patterned to form the first conductive patterns 114 separated from one another. The first seed layer 112a and the first conductive layer 114a may be patterned at the same time. The first conductive patterns 114 may fill corresponding first openings 111 and partially protrude upwardly from the first passivation layer 110. The first seed patterns 112 may be provided below corresponding first conductive patterns 114. For example, the first seed patterns 112 may cover bottom surfaces of the corresponding first conductive patterns 114.

Each of the first conductive patterns 114 may have a "T" shape when viewed in cross-section. When viewed in cross-section, each of the first seed patterns 112 may have a curved shape that extends along the bottom surface of the corresponding first conductive pattern 114. When viewed in plan, each of the first seed pattern 112 and the first conductive pattern 114 may have a circular shape, an elliptical shape, a rectangular shape, a polygonal shape, or an arbitrary shape.

Figure 1D:
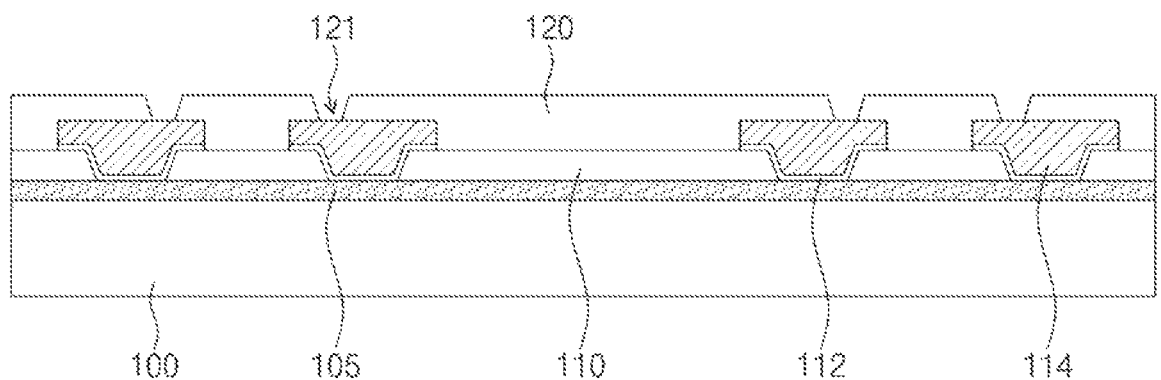

Referring to FIG. 1D, a second passivation layer 120 may be formed to cover the first passivation layer 110. For example, a dielectric material may be deposited on the first passivation layer 110, and then, patterned to form the second passivation layer 120 having one or more second openings 121. The second passivation layer 120 may include a material the same as or similar to that of the first passivation layer 110. For example, the second passivation layer 120 may include silicon oxide, silicon nitride, or polymer. Each of the second openings 121 may partially reveal the first conductive pattern 114 therebelow. When viewed in plan, each of the second openings 121 may have a circular shape, an elliptical shape, a rectangular shape, a polygonal shape, or an arbitrary shape.

Figure 1E:
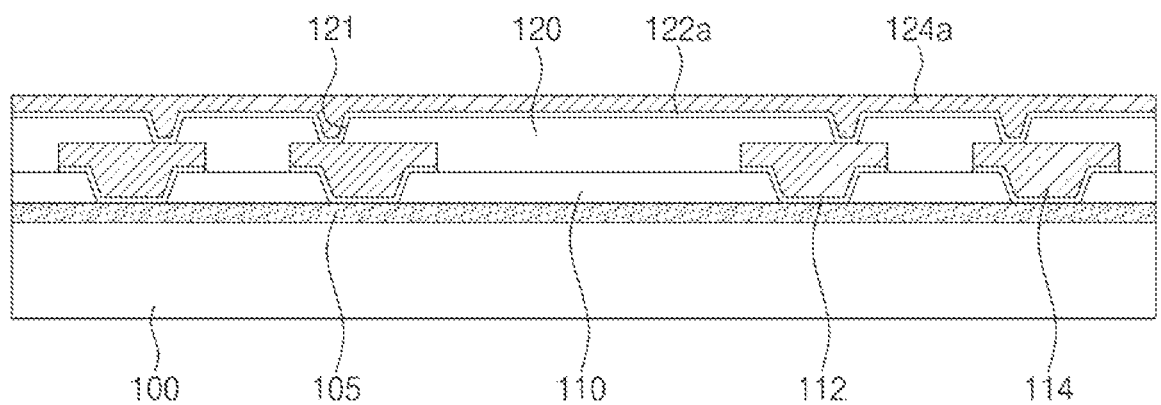

Referring to FIG. 1E, the second passivation layer 120 may be provided thereon with a second seed layer 122a having a relatively smaller thickness and a second conductive layer 124a having a relatively larger thickness. The second seed layer 122a may cover the second passivation layer 120, and also cover the first conductive patterns 114 that are partially exposed through the second openings 121. The second conductive layer 124a may have a thickness sufficient enough to cover the second seed layer 122a and fill the second openings 121.

The formation of the second seed layer 122a and the second conductive layer 124a may be the same as or similar to that of the first seed layer 112a and the first conductive layer 114a discussed above with reference to FIG. 1B. For example, the second seed layer 122a may be formed by plating or depositing metal or its alloy, such as copper (Cu), titanium (Ti), a combination thereof, or an alloy thereof. The second conductive layer 124a may be formed by an electroplating process in which the second seed layer 122a is used to plate metal, such as copper (Cu) or its alloy.

Figure 1F:
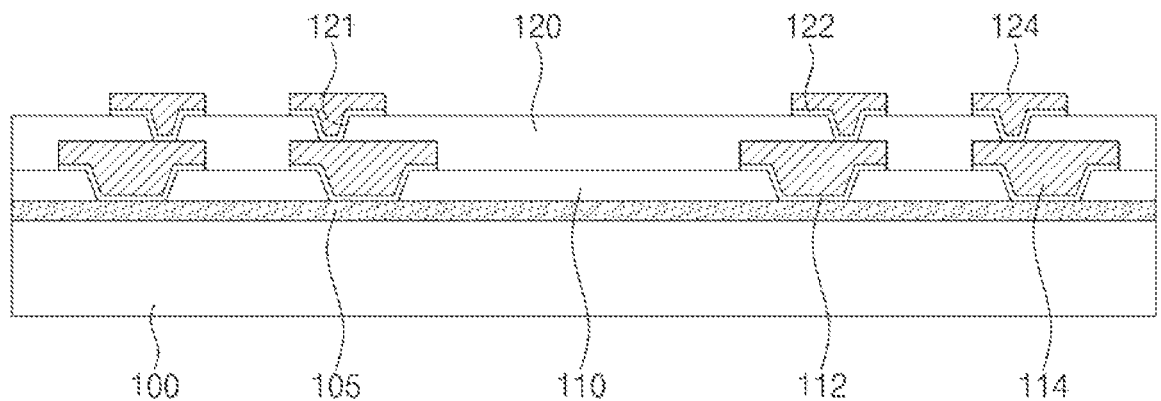

Referring to FIG. 1F, the second seed layer 122a and the second conductive layer 124a may be patterned at the same time. Therefore, the second seed layer 122a may be formed into second seed patterns 122 separated from one another. Likewise, the second conductive layer 124a may be formed into second conductive patterns 124 separated from one another. The second conductive patterns 124 may fill corresponding second openings 121 and have electrical connection with corresponding first conductive patterns 114. The second seed patterns 122 may be provided below corresponding second conductive patterns 124.

Each of the second conductive patterns 124 may have a line segment that horizontally extends on the second passivation layer 120 and a via segment that vertically penetrates the second passivation layer 120. When viewed in cross-section, each of the second seed patterns 122 may have a curved shape that extends along a bottom surface of the corresponding second conductive pattern 124.

Figure 1G:
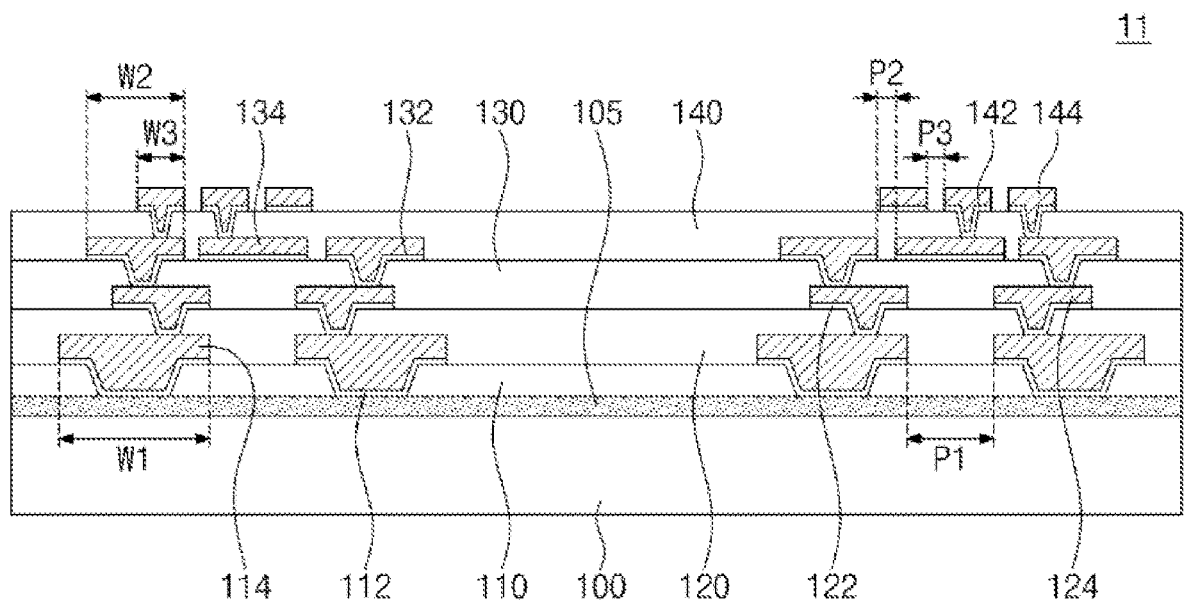
Figure 1H:
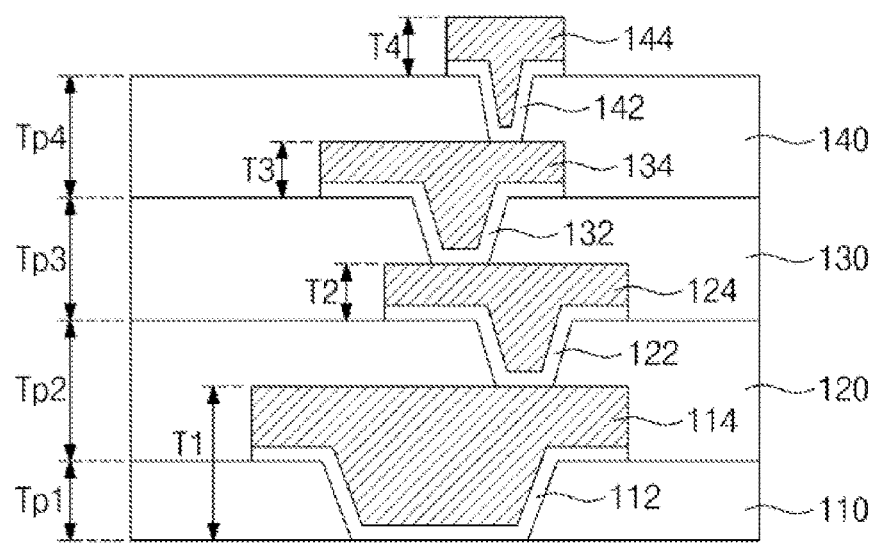
FIG. 1H illustrates an enlarged cross-sectional view showing a portion of FIG. 1G according to example embodiments.

Referring to FIG. 1G, processes identical or similar to those discussed above with reference to FIG. 1A to 1C or 1D to 1F may be performed to form on the second passivation layer 120 a third passivation layer 130, third seed patterns 132, and third conductive patterns 134. The third conductive patterns 134 may be electrically connected to corresponding second conductive patterns 124. A fourth passivation layer 140, fourth seed patterns 142, and fourth conductive patterns 144 may be formed on the third passivation layer 130. The fourth conductive patterns 144 may be electrically connected to corresponding third conductive patterns 134.

A first connection structure 11 may be provided through the processes discussed above. The first connection structure 11 may be formed in a wafer level or a chip level. For example, when the carrier substrate 100 is a bare silicon wafer or a glass substrate whose size (e.g., diameter) is identical or similar to that of the bare silicon wafer, a dicing process may further be performed to separate the wafer-level carrier substrate 100 into a plurality of chip-level first connection structures 11.

Because the first connection structure 11 includes the rigid carrier substrate 100, the first connection structure 11 may have mechanical and structural stability. Therefore, the first connection structure 11 may be prevented from warpage and/or damage, and also be easily handled in subsequent processes. The first connection structure 11 may be worked in subsequent processes, and then, utilized as a package substrate for a semiconductor package or an interposer substrate for any other semiconductor devices. These utilizations will be discussed below with reference to FIGS. 3A to 3D and 4A to 4F.

For the first connection structure 11, the first conductive pattern 114 may serve as an under-bump-metal (UBM) to which a terminal, such as a solder ball, is to be attached. In contrast, each of the second and third conductive patterns 124 and 134 may serve as a redistribution layer electrically connected to the first conductive pattern 114. The fourth conductive pattern 144 may be electrically connected to the first conductive pattern 114 through the second and third conductive patterns 124 and 134, and may be used as a connection pad to which a terminal, such as a solder ball or a solder bump, is to be attached. For another example, the fourth conductive pattern 144 may serve as a redistribution layer.

In certain embodiments, the third conductive patterns 134 and/or the fourth conductive patterns 144 may not be formed. For example, the first connection structure 11 may include the first conductive patterns 114 serving as under-bump-metals (UBMs) and the second conductive patterns 124 serving as redistribution layers, but include neither the third conductive patterns 134 nor the fourth conductive patterns 144. For another example, the first connection structure 11 may include the first conductive patterns 114 serving as under-bump-metals (UBMs), the second conductive patterns 124 serving as redistribution layers, and the fourth conductive patterns 144 serving as connection pads, but not include the third conductive patterns 134. In other embodiments, the first connection structure 11 may further include conductive patterns serving as redistribution layers between the third conductive patterns 134 and the fourth conductive patterns 144.

Each of the first, second, third, and fourth conductive patterns 114, 124, 134, and 144 may have a head segment that horizontally extends on a corresponding one of the first, second, third, and fourth passivation layers 110, 120, 130, and 140, and a tail segment that vertically penetrates the corresponding one of the first, second, third, and fourth passivation layers 110, 120, 130, and 140. The head and tail segments of the first conductive pattern 114 may be integrally merged to constitute a single under-bump-metal (UBM). Differently, the tail segment of each of the second, third, and fourth conductive patterns 124, 134, and 144 may serve as a via. The head segment of each of the second and third conductive patterns 124 and 134 may be a redistribution layer, and the head segment of the fourth conductive pattern 144 may be a connection pad.

Referring to FIG. 1H, the first conductive pattern 114 may have a thickness greater than those of the second, third, and fourth conductive patterns 124, 134, and 144. For convenience of description, the first seed pattern 112 may be a constituent element included in the first conductive pattern 114. This explanation will also be applicable to the second, third, and fourth conductive patterns 124, 134, and 144.

The first conductive pattern 114 may have a first thickness T1 greater than second, third, and fourth thicknesses T2, T3, and T4 respectively of the second, third, and fourth conductive patterns 124, 134, and 144. The second, third, and fourth thicknesses T2, T3, and T4 may be the same or similar to each other. Alternatively, the second and third thicknesses T2 and T3 may be the same or similar to each other, and the fourth thickness T4 may be greater or less than each of the second and third thicknesses T2 and T3. The first thickness T1 may indicate a total thickness of the first conductive pattern 114, and each of the second, third, and fourth thicknesses T2, T3, and T4 may indicate a thickness of a substantial portion, i.e., the head segment of a corresponding one of the second, third, and fourth conductive patterns 124, 134, and 144.

The first, second, third, and fourth passivation layers 110, 120, 130, and 140 may have different thicknesses from each other. For example, the first passivation layer 110 may have a first thickness Tp1 the same as or similar to a third thickness Tp3 of the third passivation layer 130 and a fourth thickness Tp4 of the fourth passivation layer 140. Alternatively, the first thickness Tp1 may be greater or less than each of the third and fourth thicknesses Tp3 and Tp4. The second passivation layer 120 may have a second thickness Tp2 greater than each of the first, third, and fourth thicknesses Tp1, Tp3, and Tp4. Differently, the first, second, third, and fourth passivation layers 110, 120, 130, and 140 may have the same or similar thickness.

Referring back to FIG. 1G, as discussed above with reference to FIGS. 1A to 1D, the first conductive patterns 114 may be formed after the first passivation layer 110 is formed, and then, on the first passivation layer 110, the second passivation layer 120 may be formed to cover the first conductive patterns 114. Although the first conductive patterns 114 are thicker than the second, third, and fourth conductive patterns 124, 134, and 144 as discussed above with reference to FIG. 1H, because the first passivation layer 110 is previously formed to surround the tail segments of the first conductive patterns 114, the second passivation layer 120 may be formed to cover only the head segment of the first conductive pattern 114, in which case the head segment has a thickness less than the first thickness T1 of the first conductive pattern 114. As a result, the second passivation layer 120 may be formed flat without undulation (or wavy shape) which will be discussed below.

Differently from that mentioned above, when a certain passivation layer is formed to cover the first conductive patterns 114 after the first conductive patterns 114 are formed relatively thick either on the carrier substrate 100 or on the lower passivation layer 105, it may be likely that the certain passivation layer has undulation between neighboring first conductive patterns 114. In case that the second conductive patterns 124 are formed on the certain passivation layer, the second conductive patterns 124 may bend along the undulation of the certain passivation layer. The certain passivation layer having the undulation may bring pattern abnormality to the second conductive patterns 124 formed on the certain passivation layer, and further cause pattern abnormality of any other conductive patterns formed on the second conductive patterns 124. Such pattern abnormality of conductive patterns may lead to an electrical short or open between the conductive patterns.

According to example embodiments, because the first passivation layer 110 is formed before the first conductive patterns 114, and then, the second passivation layer 120 is formed to cover the first conductive patterns 114, the second passivation layer 120 may have a flat shape without undulation. Thus, conductive patterns may be prevented from problems such as pattern abnormality caused by undulations of passivation layers.

Figure 2A:
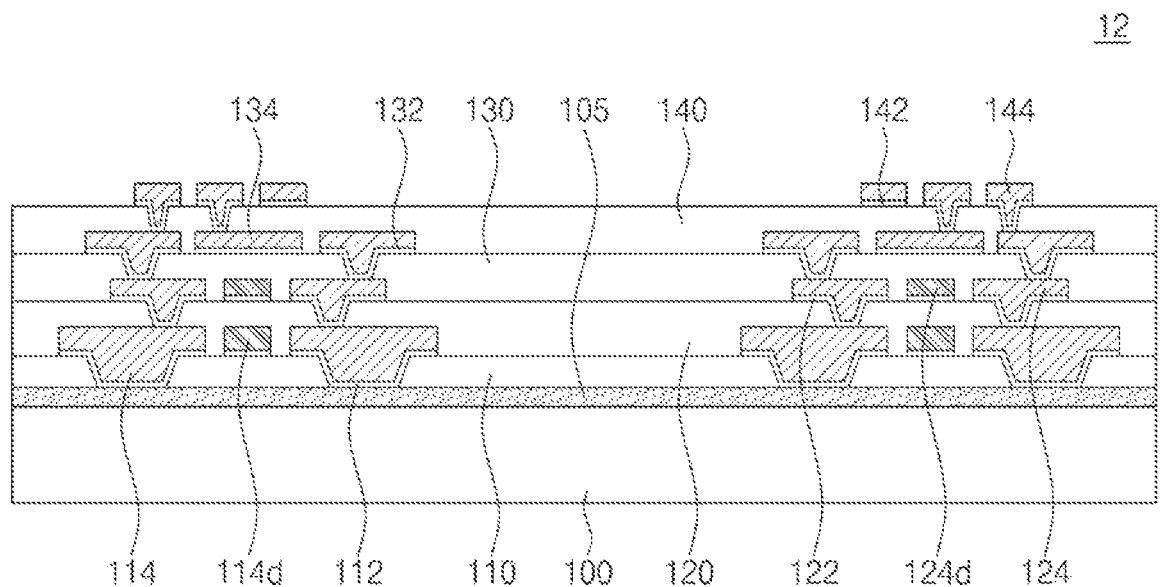
FIGS. 2A to 2C illustrate cross-sectional views showing examples of the connection structure shown in FIG. 1G used for a semiconductor package according to example embodiments.
Figure 2B:
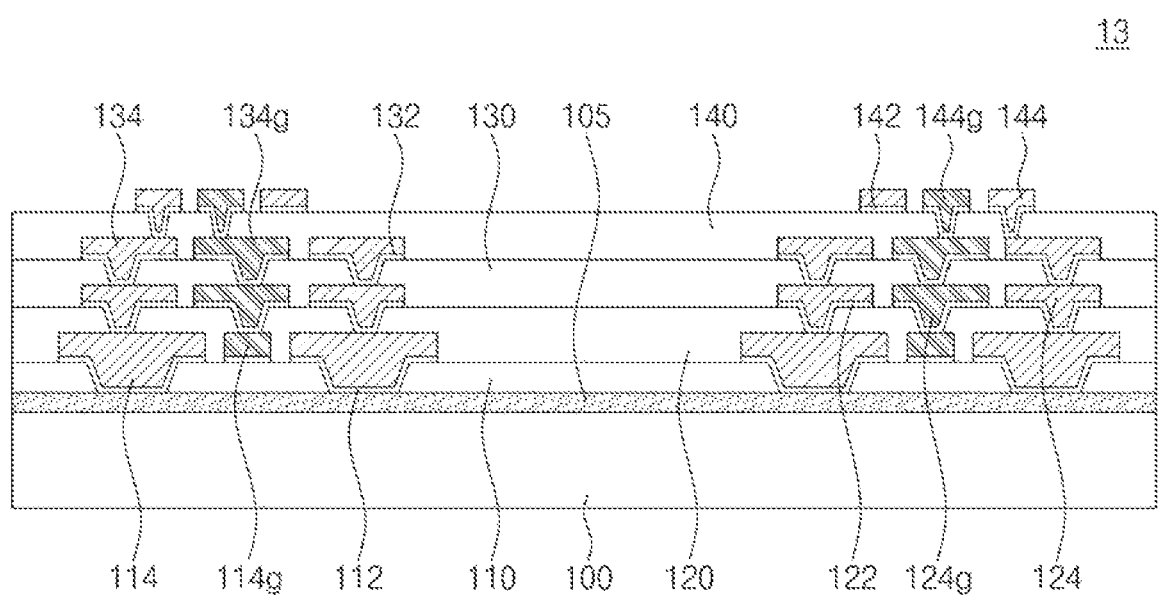
Figure 2C:
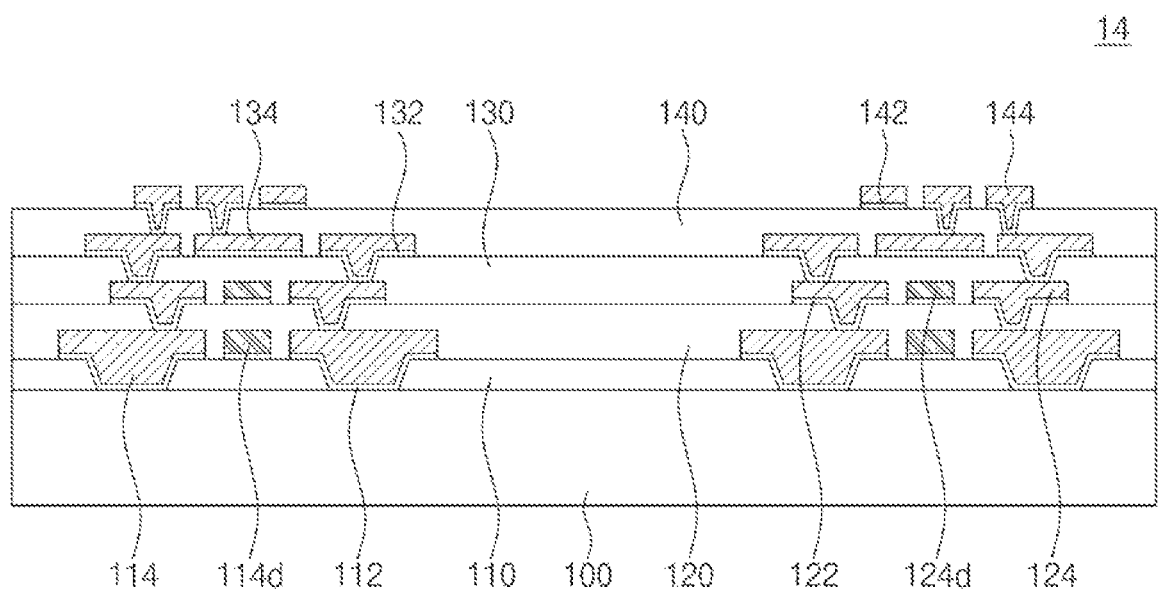

FIGS. 2A to 2C illustrate cross-sectional views showing examples of the connection structure shown in FIG. 1G for a semiconductor package according to example embodiments.

Referring to FIG. 2A, a second connection structure 12 may be provided to further include at least one first dummy pattern 114d and/or at least one second dummy pattern 124d. For example, one or more first dummy patterns 114d may be formed simultaneously with the first conductive patterns 114. Similarly, one or more second dummy patterns 124d may be formed simultaneously with the second conductive patterns 124. Although not shown, third dummy patterns may further be formed on the third passivation layer 130.

Each of the first dummy patterns 114d may be provided on the first passivation layer 110 between neighboring first conductive patterns 114. The first seed patterns 112 may be provided between the first passivation layer 110 and the first dummy patterns 114d. The first dummy patterns 114d may forbid the second passivation layer 120 to have undulation between the first conductive patterns 114. When viewed in plan, each of the first dummy patterns 114d may have a rectangular shape, a polygonal shape, a circular shape, an elliptical shape, or an arbitrary shape.

Each of the second dummy patterns 124d may be provided on the second passivation layer 120 between neighboring second conductive patterns 124. The second seed patterns 122 may be provided between the second passivation layer 120 and the second dummy patterns 124d. The second dummy patterns 124d may forbid the third passivation layer 130 to have undulation between the second conductive patterns 124. When viewed in plan, each of the second dummy patterns 124d may have a rectangular shape, a polygonal shape, a circular shape, an elliptical shape, or an arbitrary shape.

Referring to FIG. 2B, a third connection structure 13 may be provided to further include first, second, third, and fourth additional patterns 114g, 124g, 134g, and 144g. For example, one or more first additional patterns 114g may be formed simultaneously with the first conductive patterns 114. Each of the first additional patterns 114g may be provided on the first passivation layer 110 between neighboring first conductive patterns 114. The first seed patterns 112 may be provided between the first passivation layer 110 and the first additional patterns 114g. The position of the first additional patterns 114g may not be limited between the first conductive patterns 114.

Similarly, the second, third, and fourth passivation layers 120, 130, and 140 may be respectively provided thereon with the second, third, and fourth additional patterns 124g, 134g, and 144g that are electrically connected to the first additional patterns 114g. The second, third, and fourth additional patterns 124g, 134g, and 144g may be formed simultaneously with the second, third, and fourth conductive patterns 124, 134, and 144, respectively. The first, second, third, and fourth additional patterns 114g, 124g, 134g, and 144g may serve as conductive patterns either for electrical power delivery or for electrical ground. The first, second, and third additional patterns 114g, 124g, and 134g may prevent pattern abnormality such as undulation occurring when the second, third, and fourth passivation layers 120, 130, and 140 are formed.

The first, second, third, and fourth additional patterns 114g, 124g, 134g, and 144g may have their planar shapes the same as or similar to those of the first, second, third, and fourth conductive patterns 114, 124, 134, and 144, respectively. For example, when viewed in plan, the first additional patterns 114g may have a shape, such as a circular shape, the same as or similar to that of the first conductive patterns 114.

Referring to FIG. 2C, a fourth connection structure 14 may be provided devoid of the lower passivation layer 105. For example, the first passivation layer 110 may be formed directly on the carrier substrate 100, or an adhesive layer (see 101 of FIG. 1) may be provided to form the first passivation layer 110 on the carrier substrate 100. Optionally, the first dummy patterns 114d and the second dummy patterns 124d may further be formed. Instead of the first and second dummy patterns 114d and 124d, the first to fourth additional patterns 114g to 144g may further be formed as shown in FIG. 2B.

FIGS. 3A to 3D illustrate cross-sectional views showing a method of fabricating a semiconductor package according to example embodiments.

Figure 3A:
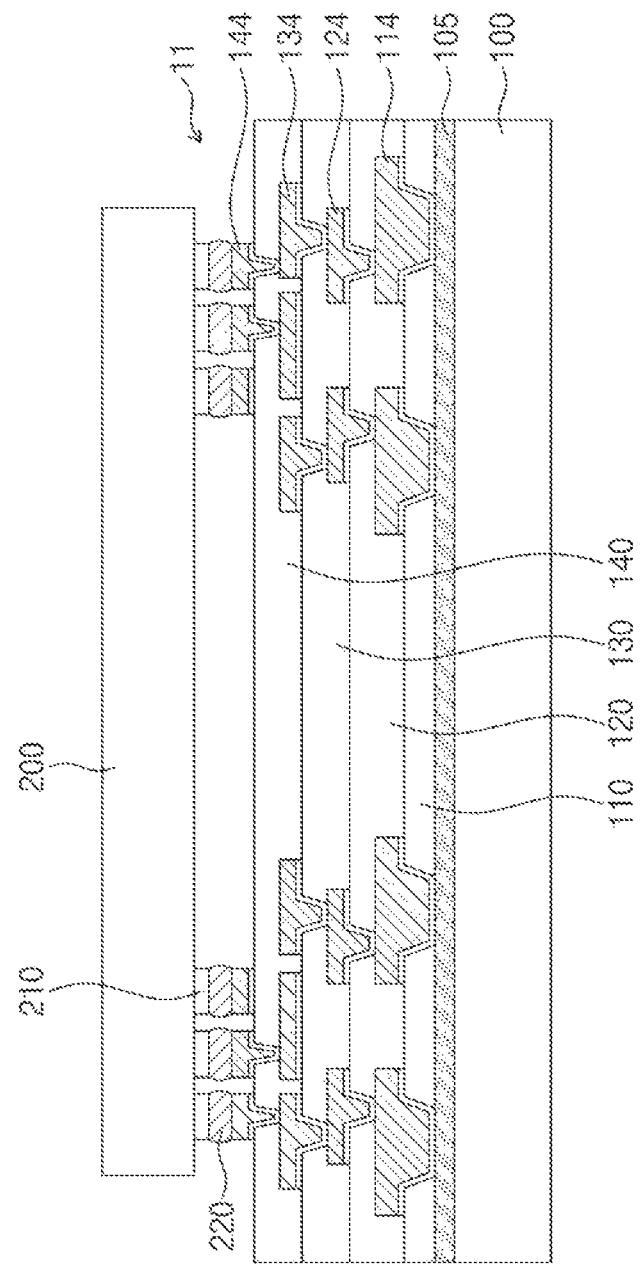
FIGS. 3A to 3D illustrate cross-sectional views showing a method of fabricating a semiconductor package according to example embodiments.

Referring to FIG. 3A, a semiconductor chip 200 may be provided on the first connection structure 11. The semiconductor chip 200 may include a memory circuit, a logic circuit, or a combination thereof. The semiconductor chip 200 may include chip pads 210 corresponding to the fourth conductive patterns 114. Connection terminals 220, such as solder balls, may be provided between the chip pads 210 and the fourth conductive patterns 144. The semiconductor chip 200 may be electrically connected through the connection terminals 220 to the first connection structure 11.

Figure 3B:
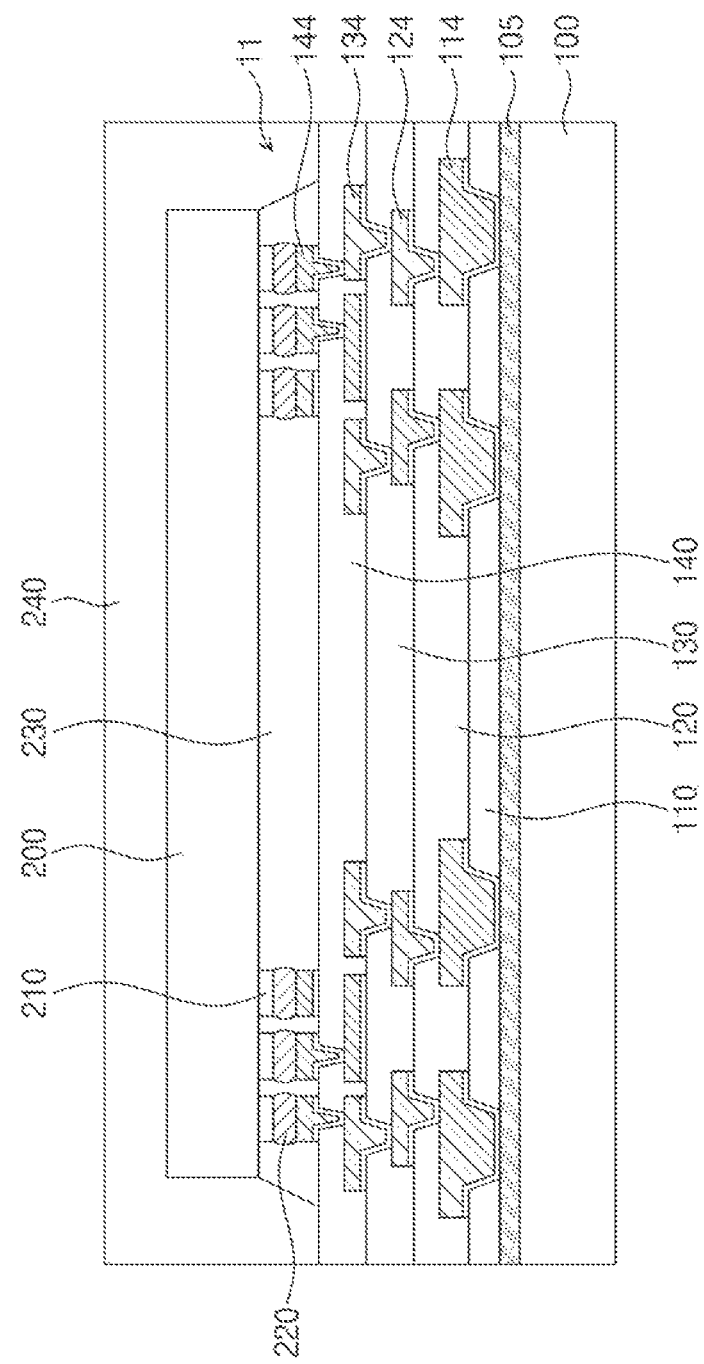

Referring to FIG. 3B, a molding layer 240 may be formed on the first connection structure 11, covering the semiconductor chip 200. The molding layer 240 may include an epoxy molding compound (EMC). Optionally, before the molding layer 240 is formed, an under-fill layer 230 may further be formed between the first connection structure 11 and the semiconductor chip 200. The under-fill layer 230 may include a material the same as or similar to that of the molding layer 240.

Figure 3C:
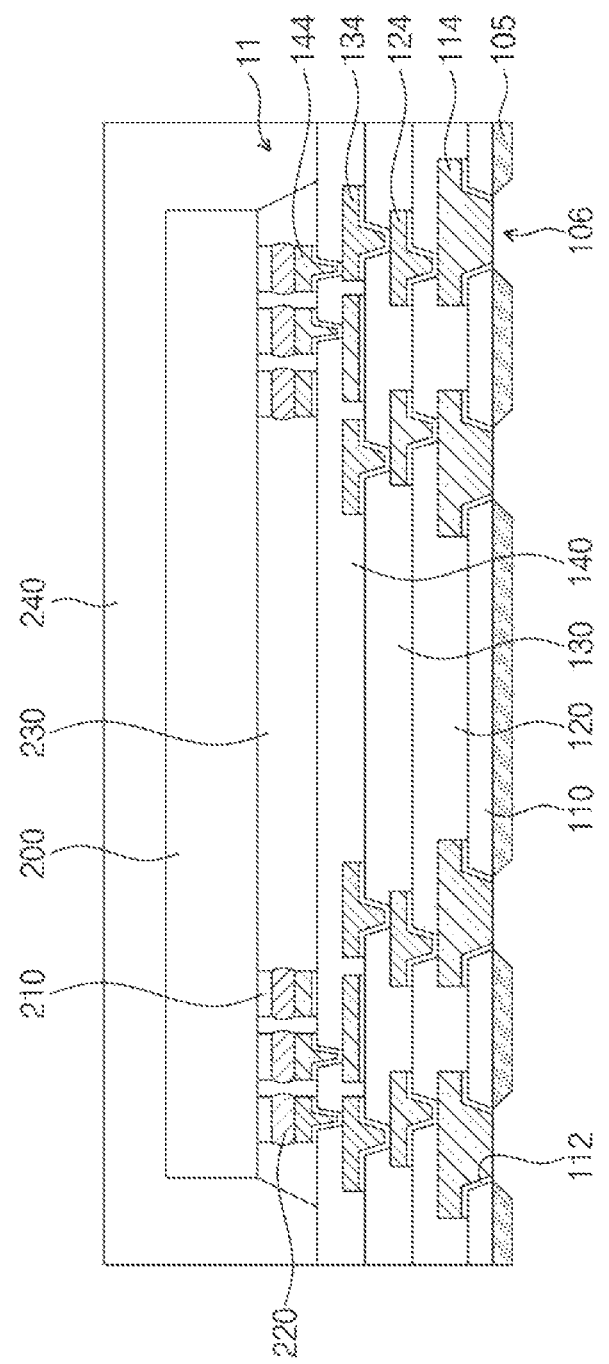

Referring to FIG. 3C, the carrier substrate 100 may be removed. When the carrier substrate 100 and the lower passivation layer 105 have therebetween the adhesive layer 101 shown in FIG. 1A, the adhesive layer 101 may be irradiated with laser or ultraviolet radiation to detach the carrier substrate 100 from the lower passivation layer 105. A patterning process may be performed on the lower passivation layer 105 that is revealed due to the detachment of the carrier substrate 100, and thus, openings 106 may be formed to expose the first conductive patterns 114. For example, the openings 106 may be formed by performing an etching process on the lower passivation layer 105. Therefore, the openings 106 may establish locations on which external terminals are to be formed (see 108 of FIG. 3D), as will be discussed below. An etching process may be optionally performed to remove a portion of the first seed pattern 112 which is exposed through the opening 106.

Figure 3D:
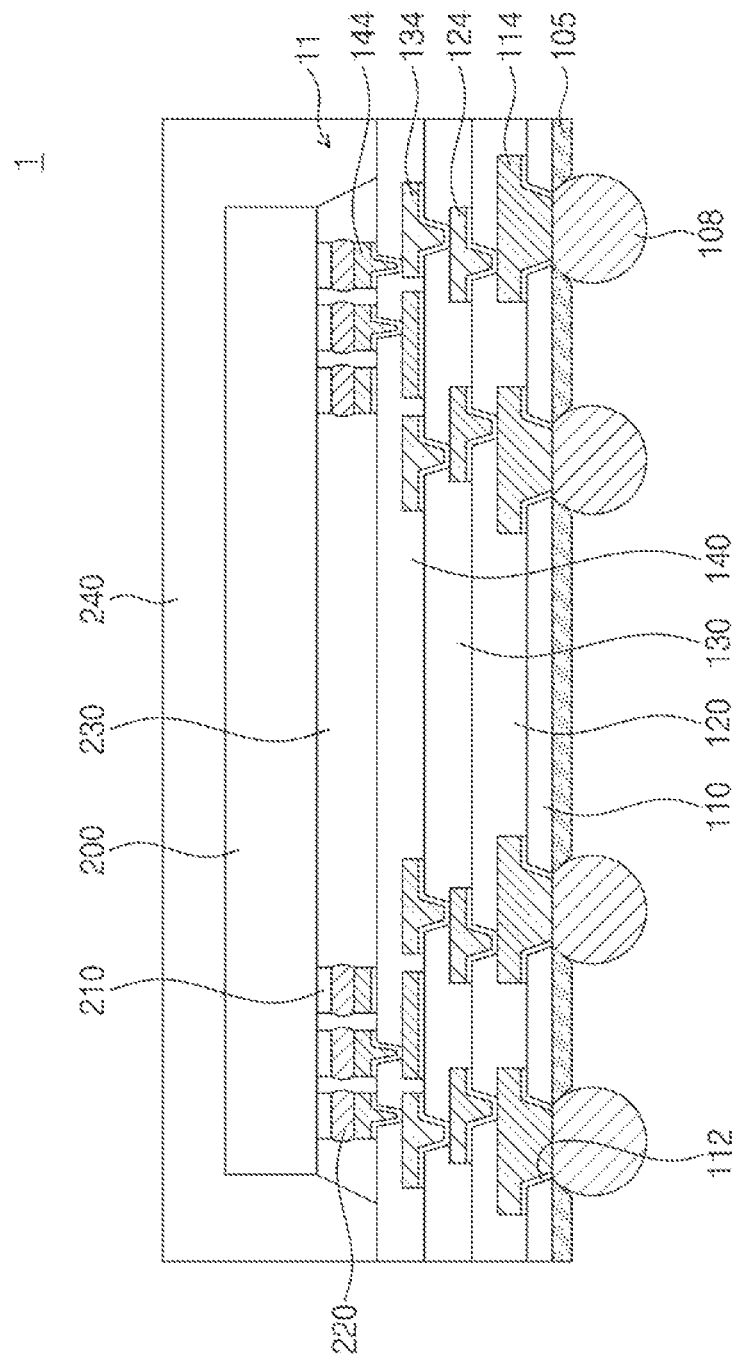

Referring to FIG. 3D, external terminals 108 may be formed to have electrical connection with the first conductive patterns 114. For example, a solder may be provided and reflowed to form the external terminals 108, such as solder balls, corresponding to the first conductive patterns 114. Hence, a semiconductor package 1 may be fabricated to include the semiconductor chip 200 mounted on the first connection structure 11. The first connection structure 11 may serve as a package substrate of the semiconductor package 1.

As discussed above with reference to FIG. 3C, a portion of the first seed pattern 112 exposed through the opening 106 may be removed. Accordingly, the first seed pattern 112 may not be provided between the first conductive pattern 114 and the external terminal 108. In this case, an intermetallic compound may not be created at an interface between the first conductive pattern 114 and the external terminal 108. Additionally or alternatively, the solder used for the formation of the external terminal 108 may have improved wettability on the first conductive pattern 114. The partial removal of the first seed pattern 112 may not be an essential process, and accordingly, may be omitted if not necessary.

FIGS. 4A to 4F illustrate cross-sectional views showing examples of the semiconductor package shown in FIG. 3D according to example embodiments.

Figure 4A:
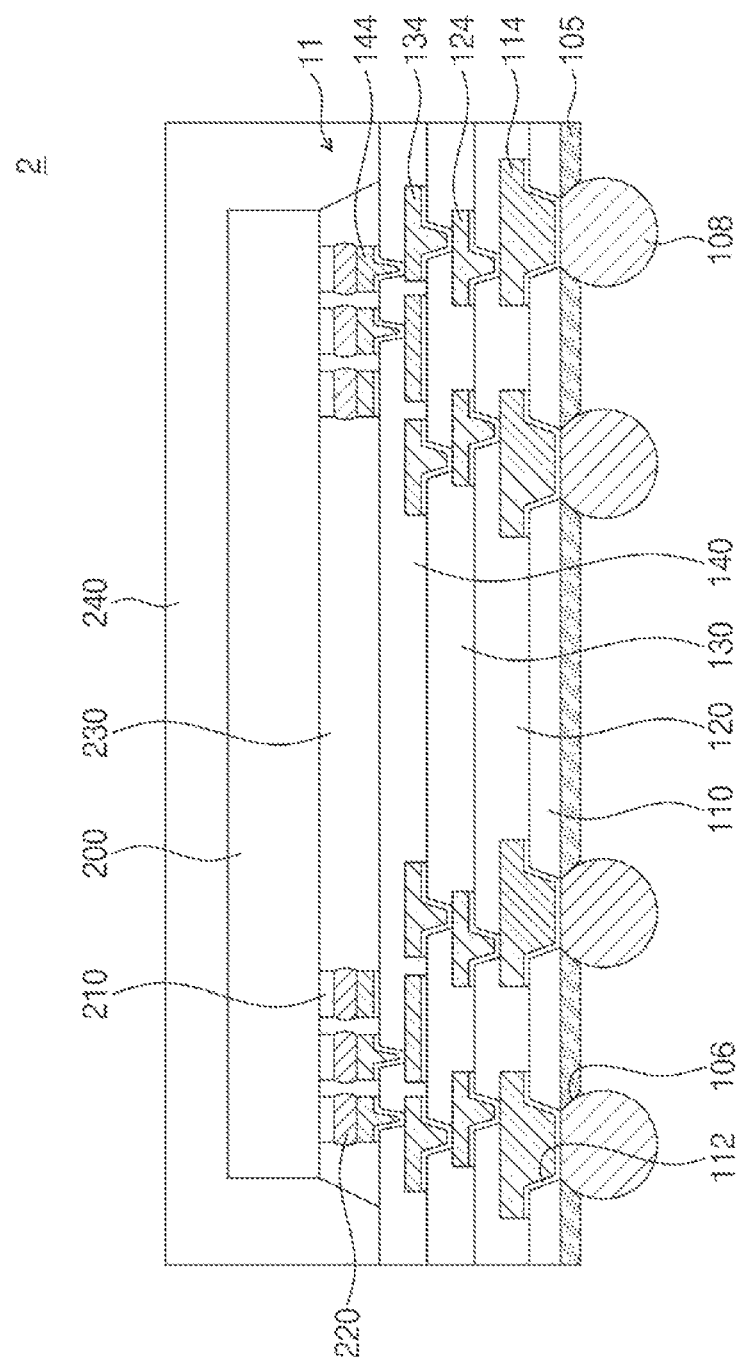

Referring to FIG. 4A, a semiconductor package 2 may be provided to include the semiconductor chip 200 mounted on the first connection structure 11 serving as a package substrate. A portion of the first seed pattern 112 exposed through the opening 106 may not be removed. Accordingly, the first seed pattern 112 may be interposed between the first conductive pattern 114 and the external terminal 108.

The first connection structure 11 may be replaced with one of the second, third, and fourth connection structures 12, 13, and 14, as will be discussed below with reference to FIGS. 4B to 4E. This detailed description may be as follows.

Figure 4B:
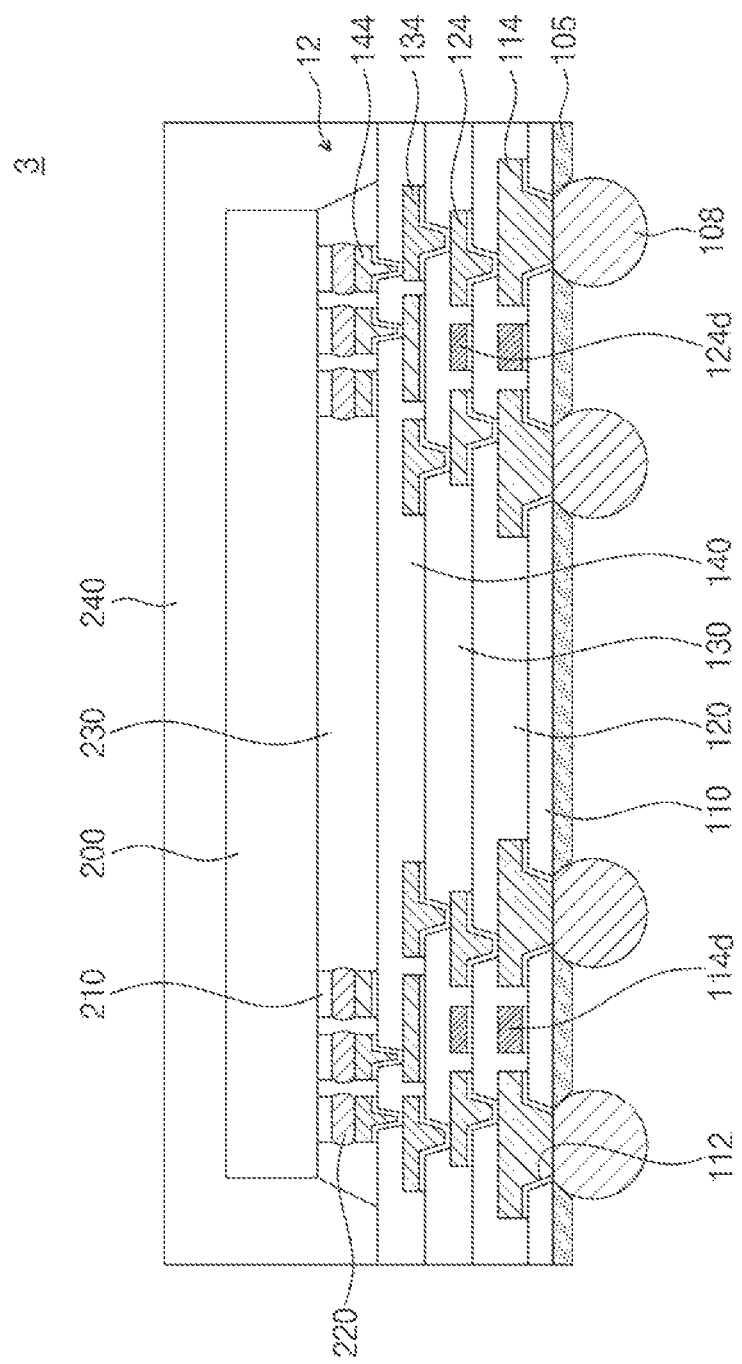

Referring to FIG. 4B, a semiconductor package 3 may be provided to include the semiconductor chip 200 mounted on the second connection structure 12 serving as a package substrate. As discussed above with reference to FIG. 2A, the second connection structure 12 may include one or more first dummy patterns 114d formed on the first passivation layer 110 between neighboring first conductive patterns 114, and one or more second dummy patterns 124d formed on the second passivation layer 120 between neighboring second conductive patterns 124. The first and second dummy patterns 114d and 124d may be electrically isolated, and thus, may have no participation in electrical connection between the second connection structure 12 and the semiconductor chip 200. As discussed above with reference to FIG. 2A, the first and second dummy patterns 114d and 124d may prevent pattern abnormality such as undulation occurring when the second and third passivation layers 120 and 130 are formed.

Figure 4C:
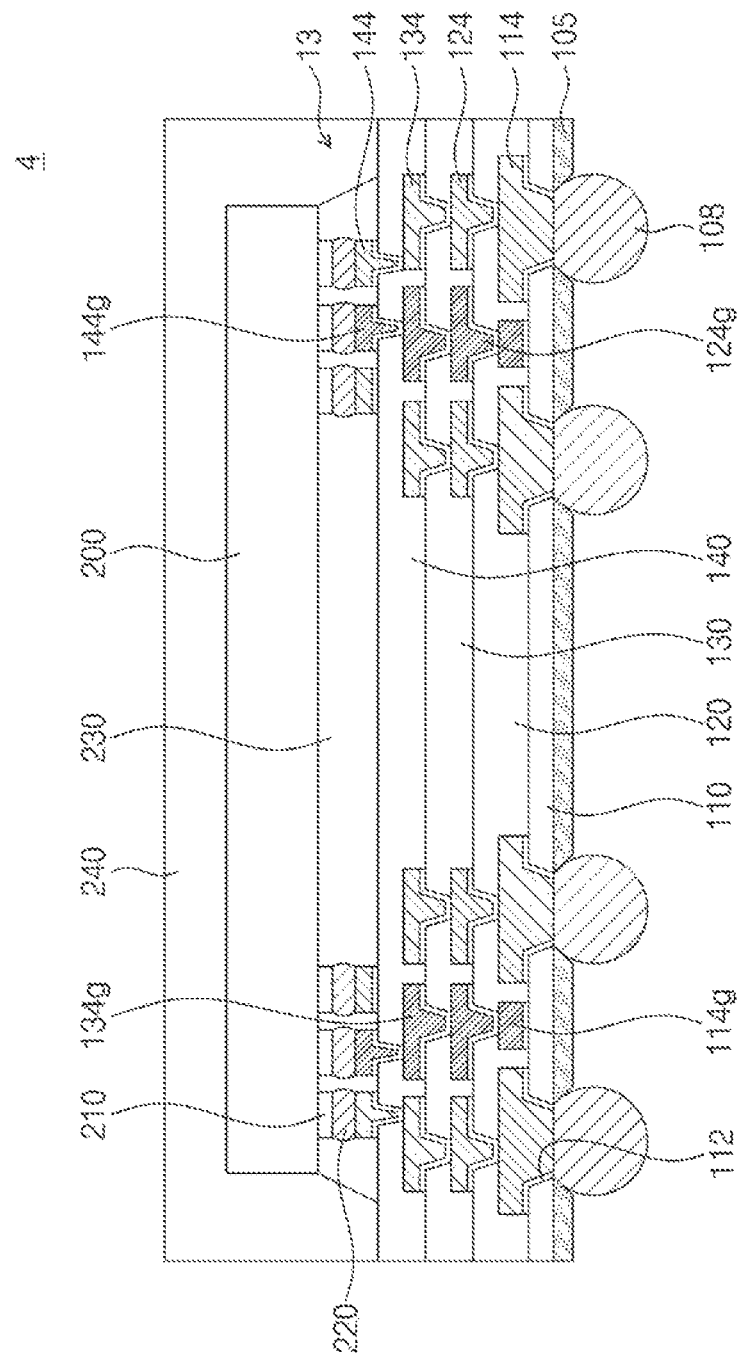

Referring to FIG. 4C, a semiconductor package 4 may be provided to include the semiconductor chip 200 mounted on the third connection structure 13 serving as a package substrate. As discussed above with reference to FIG. 2B, the third connection structure 13 may include the first, second, third, and fourth additional patterns 114g, 124g, 134g, and 144g formed respectively on the first, second, third, and fourth passivation layers 110, 120, 130, and 140. The first, second, third, and fourth additional patterns 114g, 124g, 134g, and 144g may serve as conductive patterns required to provide power to the semiconductor chip 200 or to electrically ground the semiconductor chip 200. As discussed above with reference to FIG. 2B, the first, second, and third additional patterns 114g, 124g, and 134g may prevent pattern abnormality such as undulation occurring when the second, third, and fourth passivation layers 120, 130, and 140 are formed.

Referring to FIG. 4D, a semiconductor package 5 may be provided to include the semiconductor chip 200 mounted on the fourth connection structure 14 serving as a package substrate. As discussed above with reference to FIG. 2C, the fourth connection structure 14 may include the first dummy patterns 114d formed on the first passivation layer 110 and/or the second dummy patterns 124d formed on the second passivation layer 120. Alternatively, the semiconductor package 5 may include, instead of the first and second dummy patterns 114d and 124d, the first to fourth additional patterns 114g to 144g formed respectively on the first to fourth passivation layers 110 to 140, as shown in FIG. 2B.

Figure 4E:
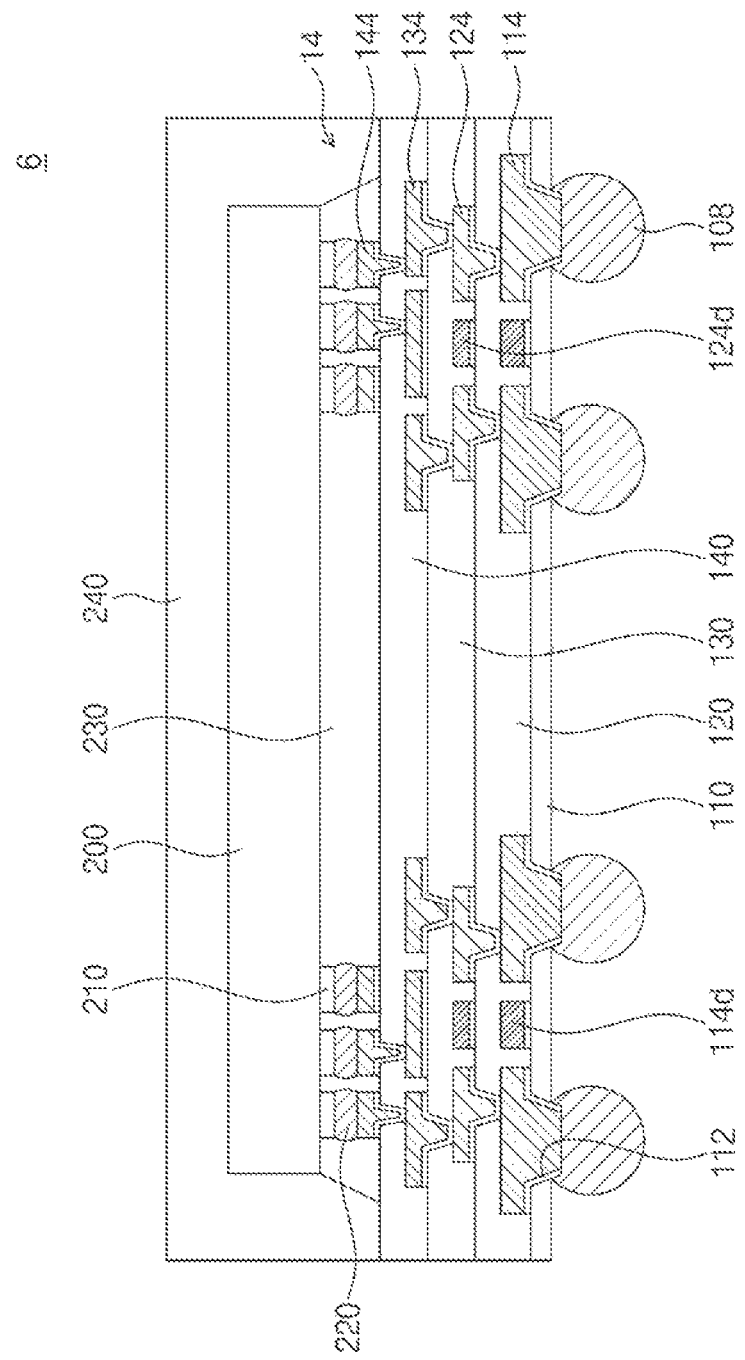

Referring to FIG. 4E, a semiconductor package 6 may be configured identically or similarly to the semiconductor package 5 shown in FIG. 4D. Differently from the semiconductor package 5, the first passivation layer 110 may be partially etched and becomes thinner. For example, the first passivation layer 110 may undergo an etching process to remove surface damages or foreign substances from the first passivation layer 110 that are possibly produced when the carrier substrate 100 is detached from the first passivation layer 110 in the fourth connection structure 14 of FIG. 2C. Additionally or alternatively, the etching process may be performed to reduce a thickness of the first passivation layer 110.

When the first passivation layer 110 decreases in thickness, the first conductive patterns 114 may protrude outwardly from the thinned first passivation layer 110. The protrusion of the first conductive patterns 114 may increase contact areas between the first conductive patterns 114 and the external terminals 108. The increased contact areas may reduce contact resistances between the first conductive patterns 114 and the external terminals 108.

Figure 4F:
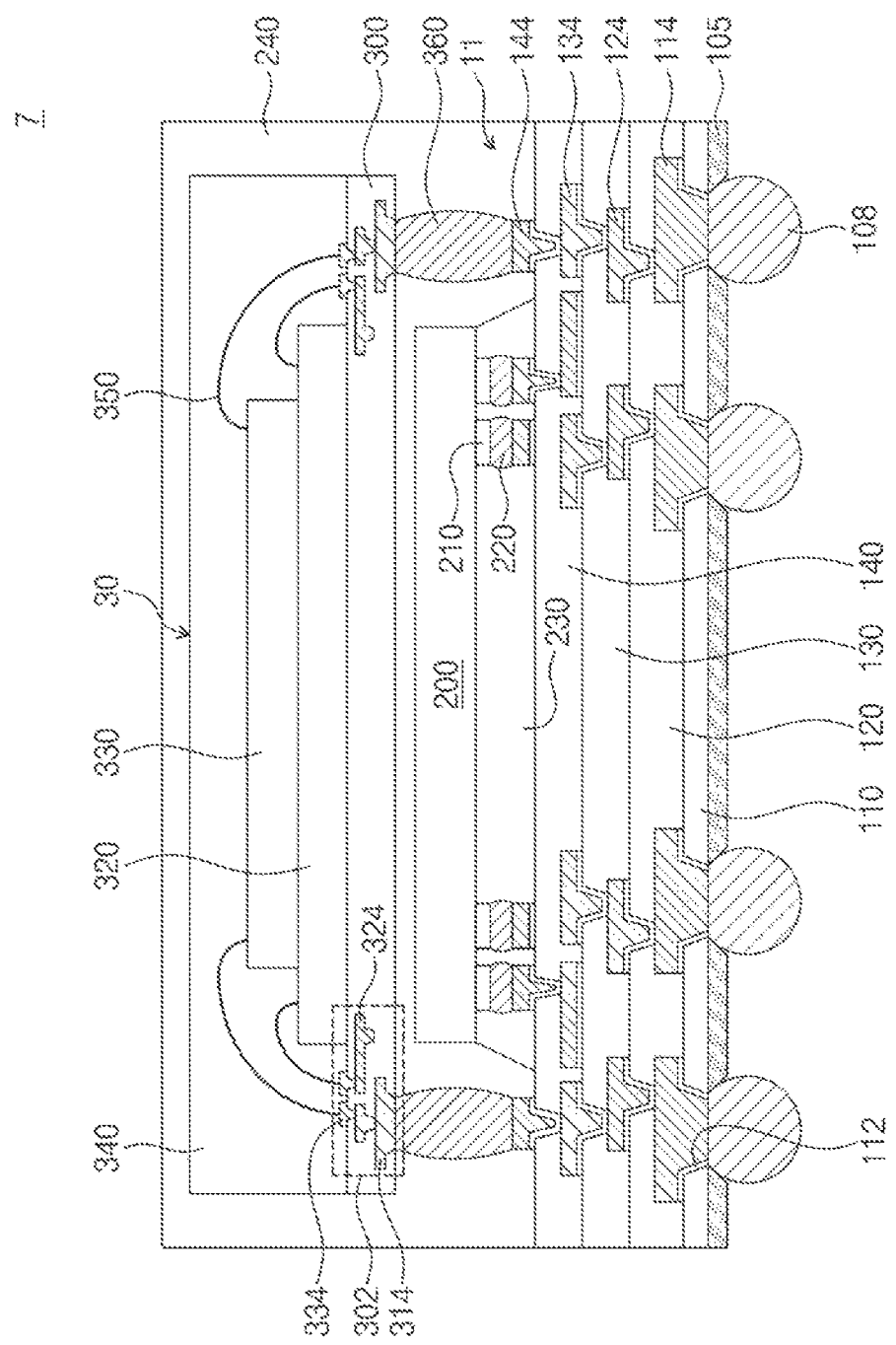

Referring to FIG. 4F, a semiconductor package 7 may be provided to include the semiconductor chip 200 and a semiconductor package 30 that are mounted on the first connection structure 11 serving as a package substrate. The semiconductor package 7 may have a package-in-package configuration in which the semiconductor package 30 is mounted within the semiconductor package 1 of FIG. 3D. The first connection structure 11 may be replaced with one of the second, third, and fourth connection structures 12, 13, and 14 shown in FIGS. 4B to 4E.

The semiconductor package 30 may include one or more semiconductor chips 320 and 330 mounted on a package substrate 300, bonding wires 350 that electrically connect the semiconductor chips 320 and 330 to the package substrate 300, and a molding layer 340 that encapsulates the semiconductor chips 320 and 330. The semiconductor package 30 may be provided within the molding layer 240 encapsulating the semiconductor chip 200.

Some of the fourth conductive patterns 144 may be used for electrical connection between the first connection structure 11 and the semiconductor chip 200. Others of the fourth conductive patterns 144 may be used for electrical connection between the first connection structure 11 and the semiconductor package 30. For example, the first connection structure 11 and the semiconductor chip 200 may be electrically connected to each other through the connection terminals 220, such as solder balls, between the chip pads 210 of the semiconductor chip 200 and some of the fourth conductive patterns 144. The first connection structure 11 and the semiconductor package 30 may be electrically connected to each other through connection terminals 360, such as solder balls, between the package substrate 300 and others of the fourth conductive patterns 144.

The package substrate 300 may include an internal pattern 302 to which the bonding wires 350 and the connection terminals 360 are electrically connected. The internal pattern 302 may be configured identically or similarly to the first connection structure 11. For example, the internal pattern 302 may include a lower conductive pattern 314 coupled to the connection terminal 360, an upper conductive pattern 334 coupled to the bonding wire 350, and an intermediate conductive pattern 324 electrically connecting the lower and upper conductive patterns 314 and 334 to each other.

The lower conductive pattern 314 may correspond to the first conductive pattern 114, the upper conductive pattern 334 may correspond to the fourth conductive pattern 144, and the intermediate conductive pattern 324 may correspond either to the second conductive pattern 124 or the third conductive pattern 134. The formation of the package substrate 300 may be the same as or similar to that of the first connection structure 11.

Figure 5:
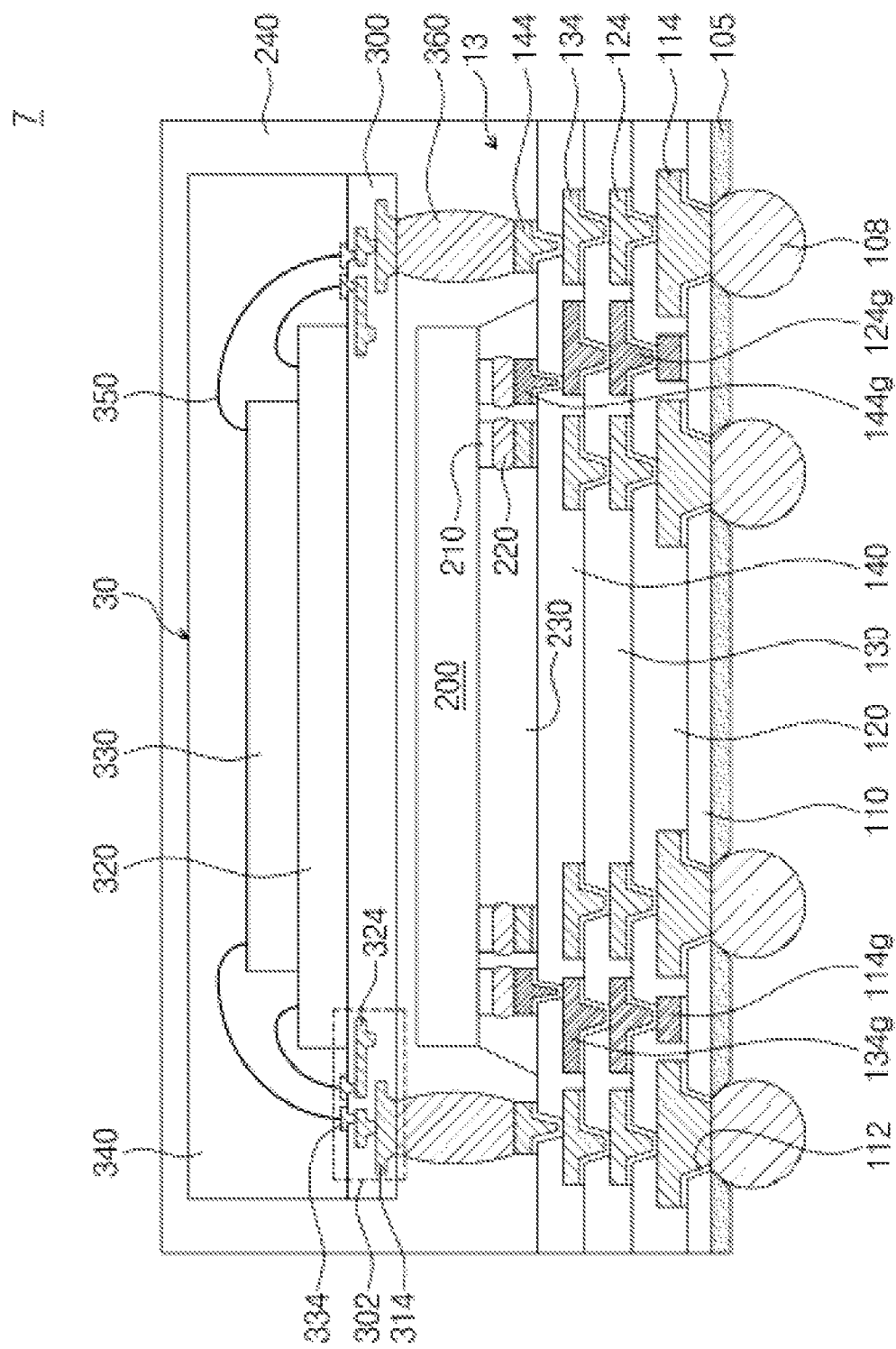
FIG. 5 illustrates a schematic diagram of a cross-sectional view of a semiconductor package according to an example embodiment.

The package substrate 300 including the internal pattern 302 may serve as an interposer or a bi-layered redistribution layer. The first connection structure 11 may be replaced with one of the second, third, and fourth connection structures 12, 13, and 14 shown in FIGS. 4B to 4E. For example. FIG. 5 schematically illustrates the semiconductor package as shown in FIG. 4F, except that the connection structure 11 is replaced by the connection structure 13 (refer to FIG. 4C).

According to embodiments of the present disclosure with reference to, for example, FIGS. 1G-4F, the conductive patterns (called "patterns" below) may have various widths and/or pitches. For example, with reference to FIG. 1G, a width W1 (in the left-right direction of FIG. 1G) of a first pattern (e.g., first conductive pattern 114) may be greater than a width W2 of a second pattern (e.g., third conductive pattern 134) that is between the first pattern (e.g., first conductive pattern 114) and a third pattern (e.g., fourth conductive pattern 144), and the width W2 of the second pattern (e.g., third conductive pattern 134) may be equal to or greater than a width W3 of the third pattern (e.g., fourth conductive pattern 144). Also, a pitch P1 between patterns of the first pattern (e.g., first conductive pattern 114) may be greater than a pitch P2 between patterns of the second pattern (e.g., third conductive pattern 134), and the pitch P2 between the patterns of the second pattern (e.g., third conductive pattern 134) may be equal to or greater than a pitch P3 between patterns of the third conductive pattern (e.g., fourth conductive pattern 144).

According to the inventive concepts, there may be no occurrence of pattern abnormality on a passivation layer between conductive patterns such as relatively thick under-bump-metals and on a certain pattern formed on the passivation layer. As such, the passivation layer or the certain pattern may be free of the pattern abnormality that possibly leads to electrical failure such as electrical short or open. In conclusion, a connection structure and a semiconductor package including the same may improve in structural stability and electrical characteristics.

This detailed description of the inventive concepts should not be construed as limited to the embodiments set forth herein, and it is intended that the inventive concepts cover the various combinations, the modifications and variations of the above-described embodiments without departing from the spirit and scope of the inventive concepts. The appended claims should be construed to include other embodiments.

What is claimed is:

1. A connection structure comprising:
    a first passivation layer comprises an opening;
    a first conductive pattern that penetrates the first passivation layer and protrudes upwardly from the first passivation layer;
    a second passivation layer on the first passivation layer and covering the first conductive pattern;
    a second conductive pattern on the second passivation layer and electrically connected to the first conductive pattern;
    a third passivation layer on the second passivation layer and covering the second conductive pattern;
    a third conductive pattern on the third passivation layer and electrically connected to the second conductive pattern; and
    an external terminal in the opening and electrically connected to the first conductive pattern,
    wherein the first conductive pattern is thicker than the second conductive pattern, and the second conductive pattern is thicker than the third conductive pattern,
    wherein a width of the first conductive pattern is greater than a width of the second conductive pattern, and the width of the second conductive pattern is equal to or greater than a width of the third conductive pattern, and
    wherein a pitch between patterns of the first conductive pattern is greater than a pitch between patterns of the second conductive pattern, and the pitch between the patterns of the second conductive pattern is equal to or greater than a pitch between patterns of the third conductive pattern.

2. The connection structure as claimed in claim 1, wherein the second passivation layer is the thickest among the first passivation layer, the second passivation layer, and the third passivation layer.

3. The connection structure as claimed in claim 1, wherein the first conductive pattern comprises:
    a head segment that horizontally extends on the first passivation layer; and
    a tail segment that vertically penetrates the first passivation layer and is connected with the external terminal,
    wherein a bottom surface of the head segment is on a top surface of the first passivation layer.

4. The connection structure as claimed in claim 3, wherein the head segment of the first conductive pattern has a thickness larger than a thickness of a redistribution layer segment, of the second conductive pattern, which horizontally extends on the second passivation layer.

5. The connection structure of claim 1, further comprising an additional pattern on at least one from among the first passivation layer and the second passivation layer.

6. The connection structure of claim 5, wherein the additional pattern is formed between the patterns of the first conductive pattern or between the patterns of the second conductive pattern.

7. The connection structure of claim 6, wherein the additional pattern is one of:
    a dummy pattern electrically isolated on the at least one from among the first passivation layer and the second passivation layer; and
    a pattern either for electrical power delivery or for electrical ground.

8. The connection structure of claim 1, wherein the second conductive pattern comprises:

a redistribution layer segment that horizontally extends on the second passivation layer; and a via segment that vertically penetrates the second passivation layer and is connected with the first conductive pattern.

9. The connection structure of claim 1, further comprising a first seed pattern on a bottom surface of the first conductive pattern, the bottom surface of the first conductive pattern facing the external terminal.

10. The connection structure of claim 9, wherein the first seed pattern is not provided at an interface between the first conductive pattern and the external terminal.

11. The connection structure of claim 1, further comprising a second seed pattern on a bottom surface of the second conductive pattern, the bottom surface of the second conductive pattern facing the first conductive pattern.

12. A semiconductor package, comprising:
a connection structure;
a semiconductor chip mounted on the connection structure;
a molding layer covering the semiconductor chip on the connection structure; and
external terminals on a bottom surface of the connection structure,
wherein the connection structure comprises:
a first passivation layer having an opening;
a first conductive pattern on the first passivation layer;
a second passivation layer on the first passivation layer and covering the first conductive pattern;
a second conductive pattern on the second passivation layer and electrically connected to the first conductive pattern;
a third passivation layer on the second passivation layer and covering the second conductive pattern; and
a third conductive pattern on the third passivation layer and electrically connected to the second conductive pattern,
wherein the first conductive pattern comprises: a head segment that horizontally extends on the first passivation layer; and a tail segment that vertically penetrates the first passivation layer and is connected with one of the external terminals, a bottom surface of the head segment is on a top surface of the first passivation layer,
wherein the semiconductor chip is connected with the connection structure through chip terminals between the third conductive pattern and chip pads which is disposed on a bottom surface of the semiconductor chip, and
wherein the first conductive pattern is the thickest among the first conductive pattern, the second conductive pattern, and the third conductive pattern, and
wherein a width of the first conductive pattern is greater than a width of the second conductive pattern, and the width of the second conductive pattern is equal to or greater than a width of the third conductive pattern.

13. The semiconductor package as claimed in claim 12, wherein the second passivation layer is the thickest among the first passivation layer, the second passivation layer, and the third passivation layer.

14. The semiconductor package as claimed in claim 12, wherein the head segment of the first conductive pattern has a thickness larger than a thickness of a redistribution layer segment, of the second conductive pattern, which horizontally extends on the second passivation layer.

15. The semiconductor package of claim 12, further comprising an additional pattern on at least one from among the first passivation layer and the second passivation layer.

16. The semiconductor package of claim 15, wherein at least one from among the first conductive pattern and the second conductive pattern is provided in plural, and
wherein the additional pattern is formed between the plurality of first conductive patterns or between the plurality of second conductive patterns.

17. The semiconductor package of claim 15, wherein the additional pattern is one of:
a dummy pattern electrically isolated on the at least one from among the first passivation layer and the second passivation layer; and
a pattern either for electrical power delivery or for electrical ground.

18. The semiconductor package of claim 15, wherein a pitch between patterns of the first conductive pattern is greater than a pitch between patterns of the second conductive pattern, and the pitch between the patterns of the second conductive pattern is equal to or greater than a pitch between patterns of the third conductive pattern.

19. A semiconductor package, comprising:
a connection structure;
a semiconductor chip mounted on the connection structure;
a molding layer covering the semiconductor chip on the connection structure; and
external terminals on a bottom surface of the connection structure,
wherein the connection structure comprises:
a first passivation layer having an opening;
a first conductive pattern on the first passivation layer;
a second passivation layer on the first passivation layer and covering the first conductive pattern;
a second conductive pattern on the second passivation layer and electrically connected to the first conductive pattern;
a third passivation layer on the second passivation layer and covering the second conductive pattern; and
a third conductive pattern on the third passivation layer and electrically connected to the second conductive pattern,
wherein the first conductive pattern comprises: a head segment that horizontally extends on the first passivation layer; and a tail segment that vertically penetrates the first passivation layer and is connected with one of the external terminals, a bottom surface of the head segment is on a top surface of the first passivation layer,
wherein the semiconductor chip is connected with the connection structure through chip terminals between the third conductive pattern and chip pads, the chip pads disposed on a bottom surface of the semiconductor chip, and
wherein the first conductive pattern is the thickest among the first conductive pattern, the second conductive pattern, and the third conductive pattern, and
wherein a pitch between patterns of the first conductive pattern is greater than a pitch between patterns of the second conductive pattern, and the pitch between the patterns of the second conductive pattern is equal to or greater than a pitch between patterns of the third conductive pattern.

20. The semiconductor package of claim 19, further comprising an additional pattern on at least one from among the first passivation layer and the second passivation layer.

* * * * *